United States Patent
Murakami

(10) Patent No.: US 7,317,358 B2
(45) Date of Patent: Jan. 8, 2008

(54) DIFFERENTIAL AMPLIFIER CIRCUIT

(75) Inventor: Tadamasa Murakami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/944,757

(22) Filed: Sep. 21, 2004

(65) Prior Publication Data

US 2005/0184805 A1 Aug. 25, 2005

(30) Foreign Application Priority Data

Feb. 24, 2004 (JP) ............................. 2004-047301

(51) Int. Cl.
*H03F 3/45* (2006.01)
(52) U.S. Cl. ..................................... 330/261; 330/258
(58) Field of Classification Search ........ 330/259–261, 330/252–254
See application file for complete search history.

(56) References Cited

U.S. PATENT DOCUMENTS

| 6,107,882 | A | * | 8/2000 | Gabara et al. ............... 330/253 |
| 6,369,621 | B1 | * | 4/2002 | Tinsley et al. ............... 327/108 |
| 6,590,980 | B1 | * | 7/2003 | Moraveji ..................... 380/255 |
| 6,617,888 | B2 | * | 9/2003 | Volk ........................... 327/67 |
| 6,703,899 | B2 | * | 3/2004 | Harberts ..................... 330/254 |

FOREIGN PATENT DOCUMENTS

JP 2001-274648 10/2001

* cited by examiner

*Primary Examiner*—Robert Pascal
*Assistant Examiner*—Hieu Nguyen
(74) *Attorney, Agent, or Firm*—Nixon Peabody LLP; Donald R. Studebaker

(57) ABSTRACT

The present invention provides a differential amplifier circuit wherein the center voltages of outputs are not affected by a variation in source potential. A node located in the middle point of a resistor connected between complementary output nodes of an amplifying unit is connected to a positive phase input terminal of an operational amplifier. An antiphase input terminal of the operational amplifier is supplied with a reference voltage. The output of the operational amplifier is supplied in common to the gates of load PMOSs connected between a source potential and the two output nodes as a control voltage. Owing to such a feedback circuit, the potential of the node reaches the reference voltage, and the center voltages of complementary output signals are not affected by the source potential and are controlled so as to always take the reference voltage.

18 Claims, 4 Drawing Sheets

DIFFERENTIAL AMPLIFIER CIRCUIT

BACKGROUND OF THE INVENTION

1. Field of the Invention

The present invention relates to stabilization of maximum amplitude values of signals outputted from a differential amplifier circuit.

2. Description of the Related Art

FIG. 1 is a circuit diagram showing a conventional differential amplifier circuit.

The present differential amplifier circuit comprises a bias unit 10 and an amplifying unit 20.

The bias unit 10 generates a bias voltage Vb for causing a constant current to flow into the amplifying unit 20 and has an operational amplifier (OP) 11 supplied with a reference voltage Vref from an unillustrated constant voltage unit. A − input terminal of the operational amplifier 11 is supplied with the reference voltage Vref and a + input terminal thereof is connected to a node N1. The node N1 is connected to a power supply or source potential VSS via a resistor 12 and connected to a power supply or source potential VDD via a P channel MOS transistor (hereinafter called "PMOS") 13. The gate of the PMOS 13 is connected to an output terminal of the operational amplifier 11 and connected to the gate of a PMOS 14 that constitutes a current mirror circuit. The source and drain of the PMOS 14 are respectively connected to the source potential VDD and a node N2. The node N2 is connected to the source potential VSS through an N channel MOS transistor (hereinafter called "NMOS") 15 whose drain and gate are connected so as to have a diode configuration. The bias voltage Vb is outputted through the node N2.

On the other hand, the amplifying unit 20 has an NMOS 21 of which the gate is supplied with the bias voltage Vb. The source and drain of the NMOS 21 are respectively connected to a source potential VSS and a node N3. The sources of NMOSs 22a and 22b are connected to the node N3. The drains of the NMOSs 22a and 22b are respectively connected to a source potential VDD through resistors 23a and 23b. Then, the gates of the NMOSs 22a and 22b are respectively supplied with input signals IN1 and IN2. Complementary output signals OUTn and OUTp are outputted from the drains of these NMOSs 22a and 22b.

The operation of the differential amplifier circuit will next be explained.

Since the − input terminal of the operational amplifier 11 is supplied with the reference voltage Vref in the differential amplifier circuit, the potential of the + input terminal also reaches the reference voltage Vref in a stable state. When the potential of the node N1 (i.e., the + input terminal of the operational amplifier 11) rises for some reason here, the voltage outputted from the operational amplifier 11 also rises. Thus, the potential applied to each of the gates of the PMOSs 13 and 14 rises so that the current that flows through each of these PMOSs 13 and 14 decreases. When the current that flows through the PMOS 13 decreases, a voltage drop developed across the resistor 12 is reduced so that the potential of the node N1 is lowered. With such a feedback operation, the potential of the node N1 is controlled so as to always reach the reference voltage Vref. Thus, the current that flows through the resistor 12 results in a constant value of Vref/R12 assuming that its resistance value is R12.

The PMOSs 13 and 14 constitute the current mirror circuits respectively, and the NMOS 15 connected in series with the PMOS 14 and the NMOS 21 provided within the amplifying unit 20 are also supplied with the bias voltage Vb in common and thereby constitute current mirror circuits respectively. Thus, the current that flows through the NMOS 21 becomes a constant value of K×Vref/R12 assuming that a mirror constant is K. Since the current that flows through the NMOS 21 is equivalent to the sum of currents that flow through the resistors 23a and 23b of the amplifying unit 20 here, the minimum values of the currents that flow through the resistors 23a and 23b become 0 and the maximum values thereof become K×Vref/R12, respectively. Thus, the maximum amplitude values of the output signals OUTn and OUTp reach K×Vref×R23/R12 assuming that the resistance values of the resistors 23a and 23b are respectively R23.

Thus, even if each of the resistance values of the resistors 12, 23a and 23b is shifted from a target value due to variations in manufacturing condition, the ratio (R23/R12) between the resistance values thereof remains unchanged if these resistors 12, 23a and 23b are formed in a common manufacturing process. Therefore, the maximum amplitude values of the output signals OUTn and OUTp can be held constant.

In the differential amplifier circuit shown in FIG. 1, however, the center voltages of the output signals OUTn and OUTp fluctuate depending on the source potential VDD. Therefore, there is a fear that when the output terminals of the differential amplifier circuit are directly connected to an input unit of a circuit provided at a subsequent stage, a dc current will flow due to the difference between the center voltages. Accordingly, a problem arises in that the differential amplifier circuit must be connected via a capacitor to cut off dc components.

SUMMARY OF THE INVENTION

With the foregoing problem in view, the present invention provides a differential amplifier circuit in which the center voltages of output signals are not affected by a variation in source potential. The differential amplifier circuit of the present invention comprises a bias unit which applies a constant voltage to a first resistor to allow a constant current to flow, thereby generating a bias voltage corresponding to the constant current, a first transistor which is connected between a first output node and a first source potential and whose conducting state is controlled by a control voltage, a second transistor which is connected between a second output node and the first source potential and whose conducting state is controlled by the control voltage, a second resistor which connects between the first and second output nodes, an operational amplifier of which a positive phase input terminal is connected to a middle point of the second resistor and a negative phase input terminal is supplied with a reference voltage to thereby output the control voltage, a third transistor which is connected between an internal node and the first output node and has a control electrode supplied with a first input signal, a fourth transistor which is connected between the internal node and the second output node and has a control electrode supplied with a second input signal, and a fifth transistor which is connected between a second source potential and the internal node and causes a constant current corresponding to the bias voltage to flow.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

The above and other objects and novel features of the present invention will become more completely apparent from the following descriptions of preferred embodiments when the same is read with reference to the accompanying drawings. The drawings, however, are for the purpose of illustration only and by no means limitative of the invention.

FIRST EMBODIMENT

Figure 1:
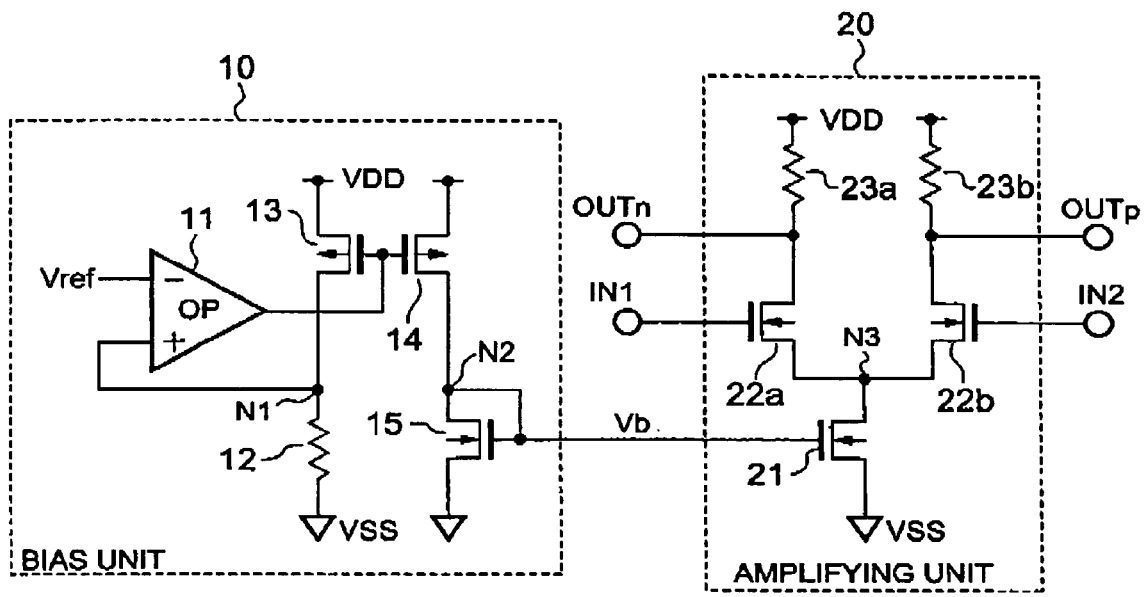
FIG. 1 is a circuit diagram showing a conventional differential amplifier circuit.
Figure 2:
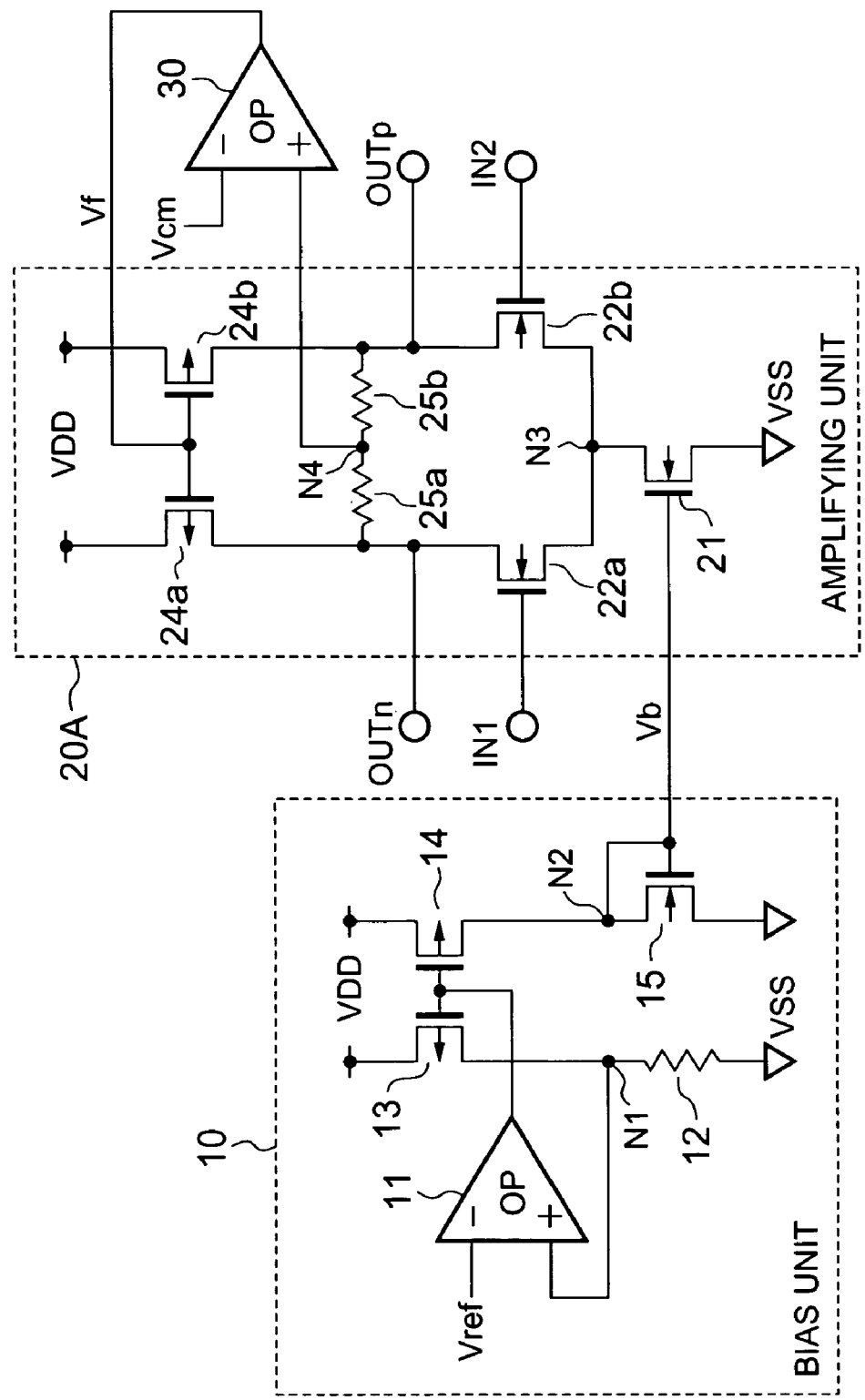
FIG. 2 is a circuit diagram of a differential amplifier circuit illustrating a first embodiment of the present invention.

FIG. 2 is a circuit diagram of a differential amplifying circuit showing a first embodiment of the present invention. Elements common to those shown in FIG. 1 are respectively identified by common reference numerals.

The present differential amplifier circuit comprises a bias unit 10 similar to FIG. 1, an amplifying unit 20A slightly different in configuration from the amplifying unit 20 shown in FIG. 1, and an operational amplifier 30.

The bias unit 10 generates a bias voltage Vb for causing a constant current to flow into the amplifying unit 20 and has an operational amplifier 11 supplied with a reference voltage Vref from an unillustrated constant voltage unit. A − input terminal of the operational amplifier 11 is supplied with the reference voltage Vref and a + input terminal thereof is connected to a node N1.

The node N1 is connected to a power supply or source potential VSS via a resistor 12 and connected to a power supply or source potential VDD via a PMOS 13. The gate of the PMOS 13 is connected to an output terminal of the operational amplifier 11 and connected to the gate of a PMOS 14 that constitutes a current mirror circuit. The source and drain of the PMOS 14 are respectively connected to the source potential VDD and a node N2. The node N2 is connected to the source potential VSS through a diode-connected NMOS 15. The bias voltage Vb is outputted through the node N2.

On the other hand, the amplifying unit 20A has an NMOS 21 of which the gate is supplied with the bias voltage Vb so that it functions as a constant current circuit. The source and drain of the NMOS 21 are respectively connected to a source potential VSS and a node N3. The sources of NMOSs 22a and 22b are connected to the node N3. The drains of the NMOSs 22a and 22b are connected to a source potential VDD through PMOSs 24a and 24b as an alternative to the conventional load resistors 23a and 23b.

Then, the gates of the NMOSs 22a and 22b are respectively supplied with input signals IN1 and IN2. Complementary output signals OUTn and OUTp are outputted from the drains of these NMOSs 22a and 22b.

Further, two resistors 25a and 25b each having the same resistance value R25 are connected in series between the drains of the NMOSs 22a and 22b. A + input terminal of the operational amplifier 30 is connected to a node N4 corresponding to a connecting point of the resistors 25a and 25b. A − input terminal of the operational amplifier 30 is supplied with a reference voltage Vcm from an unillustrated constant voltage unit. The operational amplifier 30 supplies a feedback control voltage Vf to the gates of the PMOSs 24a and 24b.

The operation of the present embodiment will next be described.

The operation of the bias unit 10 employed in the differential amplifier circuit is as described in the Background Art. With the feedback operation of the operational amplifier 11, the potential of the node N1 becomes identical to the reference voltage Vref supplied from the constant voltage unit, and a constant current of Vref/R12 (where R12 indicates the resistance value of the resistor R12) flows through the resistor 12. Further, the PMOSs 13 and 14 each constituting the current mirror circuit and the NMOS 15 connected in series with the PMOS 14 generate a bias voltage Vb for causing a constant current K×Vref/R12 to flow into the NMOS 21 provided within the amplifying unit 20, at the node N2.

On the other hand, in the amplifying unit 20A, the potential of the node N4 is supplied to the + input terminal of the operational amplifier 30 and the reference voltage Vcm is supplied to the − input terminal of the operational amplifier 30. Further, the control voltage Vf is fed back from the operational amplifier 30 to the gates of the PMOSs 24a and 24b. With the feedback operation of such an operational amplifier 30, the potential of the node N4 results in the reference voltage Vcm.

Thus, the constant current of the NMOS 21 flows from a series circuit of the PMOS 24a and the NMOS 22a and a series circuit of the PMOS 24b and the NMOS 22b with being divided in half in a state in which no input signals IN1 and IN2 are being inputted, and no current flows through the resistors 25a and 25b. Therefore, both of the output signals OUTn and OUTp result in the reference voltage Vcm.

Since the conducting states of the NMOSs 22a and 22b change according to the input signals IN1 and IN2 in a state in which the input signals IN1 and IN2 are being inputted, the magnitudes of the currents that flow through the NMOSs 22a and 22b change. On the other hand, since the gates of the PMOSs 24a and 24b are supplied with the control voltage Vf from the operational amplifier 30 in common, the magnitudes of the currents that flow through the PMOSs 24a and 24b are equal and result in ½ of the constant current that flows through the NMOS 21.

Therefore, the difference between the current that flows through the PMOS 24a and the current that flows through the NMOS 22a flows through the resistors 25a and 25b. Thus, even in the state in which the input signals IN1 and IN2 are being inputted, the center voltages of the output signals OUTn and OUTp result in the reference voltage Vcm which does not depend on the source potential VDD. The maximum amplitude values of the output signals OUTn and OUTp become K×Vref×R25/R12 and are not affected by a variation in manufacturing process.

As described above, the differential amplifier circuit according to the first embodiment includes the PMOSs 24a and 24b connected between the two output terminals and the source potential VDD, the resistors 25a and 25b connected between these output terminals, and the operational amplifier 30 which supplies the control voltage Vf to the gates of the PMOSs 24a and 24b in common and controls the node N4 such that the node N4 reaches the reference voltage Vcm. Thus, a differential amplifier circuit is obtained wherein the center voltages of output signals are not affected by a variation in source potential. Accordingly, an advantage is obtained in that if the present differential amplifier circuit is used, then it can be connected to an input unit of a circuit provided at a subsequent stage without involving a dc cut-off capacitor.

Also an advantage is brought about in that since the load PMOSs 24a and 24b are used instead of the conventional load resistors 23a and 23b, a large maximum amplitude value can be obtained by setting high the resistance values of the resistors 25a and 25b even at a low power supply voltage.

Incidentally, although the differential amplifier circuit shown in FIG. 2 is provided with the NMOS-based constant current circuit on the source potential VSS side, it may take such a configuration that a PMOS-based constant current circuit is provided on the source potential VDD side. The differential amplifier circuit may be configured using bipolar transistors as an alternative to the MOS transistors. Such modifications can be similarly applied even to the second and third embodiments.

SECOND EMBODIMENT

Figure 3:
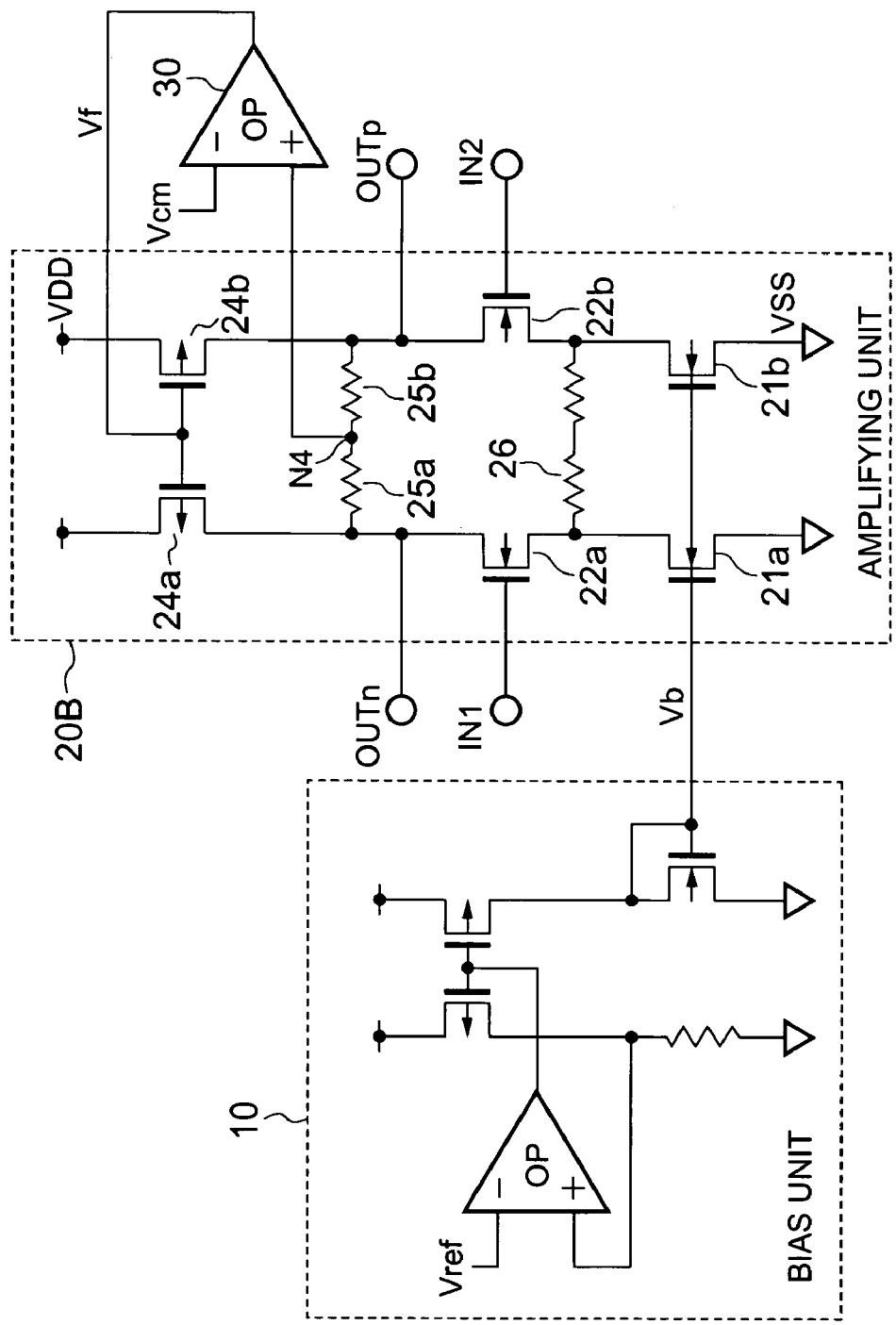
FIG. 3 is a circuit diagram of a differential amplifier circuit depicting a second embodiment of the present invention.

FIG. 3 is a circuit diagram of a differential amplifier circuit showing a second embodiment of the present invention. Elements common to those shown in FIG. 2 are respectively identified by common reference numerals.

The differential amplifier circuit is provided with an amplifying unit 20B slightly different in configuration from the amplifying unit 20A shown in FIG. 2 as an alternative to the amplifying unit 20A.

The amplifying unit 20B is one wherein the node N3 of the amplifying unit 20A and the NMOS 21 of the constant current circuit are eliminated and instead the sources of NMOSs 22a and 22b are connected to each other through resistors 26, and NMOSs 21a and 21b each used as a constant current circuit connect between the sources of these NMOSs 22a and 22b and a source potential VSS. The gates of the NMOSs 21a and 21b are supplied with a bias voltage Vb from a bias unit 10. The differential amplifier circuit is similar to FIG. 2 in other configuration.

Since the sources of the NMOSs 22a and 22b are connected to each other by the resistors 26 in the differential amplifier circuit, effective input transconductance $g_m^{in}$ of a combination of the NMOSs 22a and 22b and the resistors 26 is given as follows:

$$g_m^{in}=gm/(1+R26 \times gm)$$

wherein gm indicates transconductance of the NMOSs 22a and 22b, and R26 indicates the resistance value of the resistor 26.

When R26×gm is extremely larger than 1 here, $g_m^{in}=1/R26$ is reached. Thus, the voltage gain of the differential amplifier circuit results in R25/R26. On the other hand, the maximum amplitude values of output signals OUTn and OUTp are respectively given as K×Vref×R25/R12 in a manner similar to FIG. 2.

In the differential amplifier circuit according to the second embodiment as described above, the sources of the NMOSs 22a and 22b of the differential amplifier circuit according to the first embodiment are connected to each other by the resistors 26, and the NMOSs 21a and 21b each of which serves as the constant current circuit, are connected to their corresponding sources of the NMOSs 22a and 22b. Thus, since the voltage gain becomes R25/R26 corresponding to the ratio between the resistance values of the resistors 25a and 25b and the resistance values of the resistors 26, an advantage is brought about in that the voltage gain is not affected by a variation in manufacturing process, in addition to the advantage similar to the first embodiment.

THIRD EMBODIMENT

Figure 4:
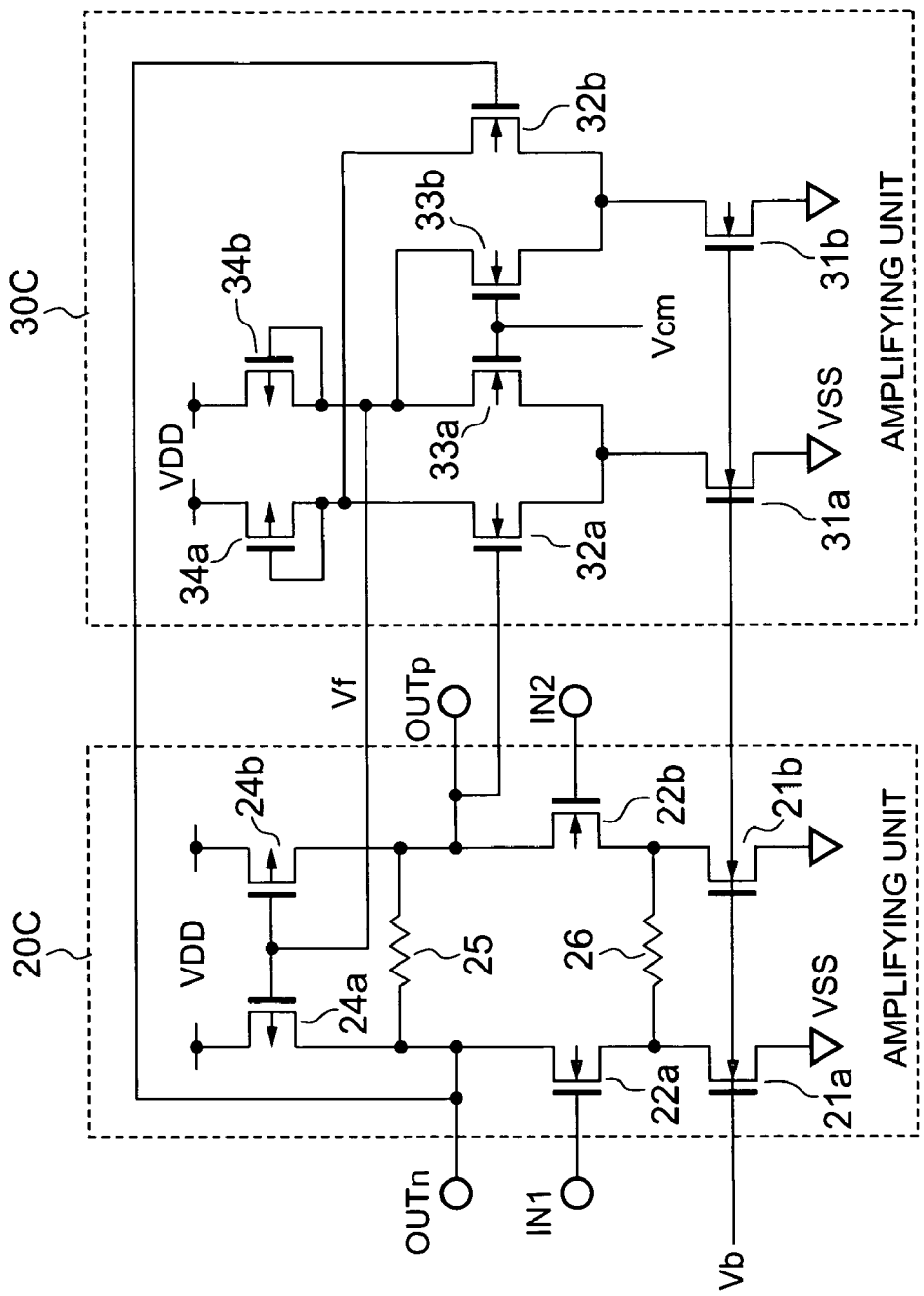
FIG. 4 is a circuit diagram of an amplifying section showing a third embodiment of the present invention.

FIG. 4 is a circuit diagram of an amplifying section showing a third embodiment of the present invention.

The amplifying section comprises an amplifying unit 20C corresponding to the amplifying unit 20B shown in FIG. 3 and an amplifying unit 30C corresponding to the operational amplifier 30 shown in FIG. 3, both of which are used as an alternative to the amplifying unit 20B and operational amplifier 30 shown in FIG. 3. Incidentally, elements common to those shown in FIG. 3 are respectively identified by common reference numerals.

The amplifying unit 20C is one wherein a resistor 25 is used as an alternative to the resistors 25a and 25b of the amplifying unit 20B in FIG. 3 and thereby the node N4 is deleted.

On the other hand, the amplifying unit 30C is equivalent to one of a 4-input multiplier type wherein a feedback control voltage Vf is outputted using output signals OUTn and OUTp outputted from the amplifying unit 20C and a reference voltage Vcm supplied from a constant voltage unit as inputs.

The amplifying unit 30C has NMOSs 31a and 31b of which the gates are supplied with a bias voltage Vb such that constant current circuits are configured. The sources of the NMOSs 31a and 31b are respectively connected to a source potential VSS.

The drain of the NMOS 31a is connected to the sources of NMOSs 32a and 33a, and the drain of the NMOS 31b is connected tote sources of NMOSs 32b and 33b. Further, the drains of the NMOSs 32a and 32b are respectively connected to the drain and gate of a PMOS 34a. Also the drains of the NMOSs 33a and 33b are respectively connected to the drain and gate of the PMOS 34b. The sources of the PMOSs 34a and 34b are respectively connected to a source potential VDD.

Then, the gates of the NMOSs 32a and 32b are respectively supplied with the output signals OUTp and OUTn outputted from the amplifying unit 20C. The gates of the NMOSs 33a and 33b are respectively supplied with the reference voltage Vcm delivered from the unillustrated constant voltage unit. Further, the potential at the drain of the NMOS 33a is supplied to the gates of PMOSs 24a and 24b of the amplifying unit 20C as the feedback control voltage Vf.

In the present amplifying section, the output signals OUTn and OUTp of the amplifying unit 20C are supplied to the amplifying unit 30C. The amplifying unit 30C outputs a control voltage Vf proportional to the difference between (OUTn+OUTp) and (Vcm+Vcm). The control voltage Vf is fed back to the gates of the PMOSs 24a and 24b of the amplifying unit 20C in common. Thus, the potentials of the output signals OUTn and OUTp are controlled in a manner similar to the first embodiment, so that OUTn+OUTp=2Vcm is reached. That is, the center voltages of the output signals OUTn and OUTp result in Vcm.

As described above, the third embodiment also brings about an advantage similar to the second embodiment.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A differential amplifier circuit, comprising:
   a bias unit which generates a bias voltage;
   a first transistor which is connected between a first output node and a first source potential and whose conducting state is controlled by a control voltage;
   a second transistor which is connected between a second output node and the first source potential and whose conducting state is controlled by the control voltage;
   a plurality of resistors of essentially equal resistance values connected in series between the first and second output nodes;
   an operational amplifier, of which a positive phase input terminal is connected between the resistors, and a negative phase input terminal is supplied with a reference voltage to thereby output the control voltage;
   a third transistor which is connected between a first internal node and the first output node and has a control electrode supplied with a first input signal;
   a fourth transistor which is connected between a second internal node and the second output node and has a control electrode supplied with a second input signal;
   a resistance circuit which connects between the first and second internal nodes;
   a fifth transistor which is connected between a second source potential and the first internal node and causes a constant current corresponding to the bias voltage to flow; and
   a sixth transistor which is connected between the second source potential and the second internal node and causes a constant current corresponding to the bias voltage to flow.

2. The differential amplifier circuit according to claim 1, wherein the first to sixth transistors are MOS transistors.

3. The differential amplifier circuit according to claim 2, wherein the first and second transistors have a first conductive type and the third to sixth transistors have a second conductive type which is opposite to the first conductive type.

4. The differential amplifier circuit according to claim 3, wherein the first conductive type is P-conductive type and the second conductive type is N-conductive type.

5. The differential amplifier circuit according to claim 1, wherein the first source potential is a power supply potential and the second source potential is a ground potential.

6. The differential amplifier circuit according to claim 1, wherein the operational amplifier has a voltage gain which depends on resistance values of the second and third resistors.

7. The differential amplifier circuit according to claim 1, wherein the resistance circuit has a plurality of resistive elements.

8. The differential amplifier circuit according to claim 7, wherein the resistive elements are connected in series between the first internal node and the second internal node.

9. The differential amplifier circuit according to claim 1, wherein the bias unit includes a resistance element which passes a constant current through itself, and wherein the bias voltage is generated based on the constant current through the resistance element.

10. A differential amplifier circuit, comprising:
    a bias unit which generates a bias voltage;
    a first transistor which is connected between a first output node and a first source potential and has a control electrode;
    a second transistor which is connected between a second output node and the first source potential and has a control electrode;
    first and second resistors which is connected in series between the first and second output nodes, wherein a resistance value of the first resistor is essentially equal to that of the second resistor;
    an operational amplifier which has a positive phase input node connected to both of the first and second resistors, a negative phase input terminal supplied with a reference voltage and an output node connected to the control electrodes of the first and second transistors;
    a third transistor which is connected between a first internal node and the first output node and has a control electrode supplied with a first input signal;
    a fourth transistor which is connected between a second internal node and the second output node and has a control electrode supplied with a second input signal;
    a resistance circuit which connects between the first and second internal nodes;
    a constant current circuit which is connected between the first and second internal nodes and a second source potential lower than the first source potential, wherein the constant current circuit is controlled by the bias voltage.

11. The differential amplifier circuit according to claim 10, wherein the first to fourth transistors are MOS transistors.

12. The differential amplifier circuit according to claim 11, wherein the first and second transistors have a first conductive type and the third and fourth transistors have a second conductive type which is opposite to the first conductive type.

13. The differential amplifier circuit according to claim 12, wherein the first conductive type is P-conductive type and the second conductive type is N-conductive type.

14. The differential amplifier circuit according to claim 10, wherein the first source potential is a power supply potential and the second source potential is a ground potential.

15. The differential amplifier circuit according to claim 10, wherein the operational amplifier has a voltage gain which depends on the resistance values of the first and second resistors.

16. The differential amplifier circuit according to claim 10, wherein the resistance circuit has a plurality of resistive elements.

17. The differential amplifier circuit according to claim 16, wherein the resistive elements are connected in series between the first internal node and the second internal node.

18. The differential amplifier circuit according to claim 10, wherein the bias unit includes a resistance element which passes a constant current through itself, and wherein the bias voltage is generated based one the constant through the resistance element.

* * * * *